United States Patent
Hsiao et al.

(10) Patent No.: US 9,064,892 B2
(45) Date of Patent: Jun. 23, 2015

(54) SEMICONDUCTOR DEVICES UTILIZING PARTIALLY DOPED STRESSOR FILM PORTIONS AND METHODS FOR FORMING THE SAME

(75) Inventors: Wen Chu Hsiao, Tainan (TW); Ju Wen Hsiao, Tainan (TW); Ying Min Chou, Tainan (TW); Hsiang Hsiang Ko, Sinying (TW); Ying-Lang Wang, Tien-Chung Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/221,160

(22) Filed: Aug. 30, 2011

(65) Prior Publication Data

US 2013/0049101 A1   Feb. 28, 2013

(51) Int. Cl.
*H01L 29/78* (2006.01)
*H01L 29/66* (2006.01)
*H01L 29/165* (2006.01)

(52) U.S. Cl.
CPC ...... *H01L 29/66636* (2013.01); *H01L 29/7834* (2013.01); *H01L 29/7848* (2013.01); *H01L 29/165* (2013.01)

(58) Field of Classification Search
CPC ............... H01L 29/78; H01L 29/7848; H01L 29/66636; H01L 29/7834
USPC .................... 257/330, 327, 335, 339, E29.256
See application file for complete search history.

(56) References Cited

U.S. PATENT DOCUMENTS

| | | | |
|---|---|---|---|
| 7,667,271 B2 | 2/2010 | Yu et al. | |
| 8,362,575 B2 | 1/2013 | Kwok et al. | |
| 8,367,498 B2 | 2/2013 | Chang et al. | |
| 8,440,517 B2 | 5/2013 | Lin et al. | |
| 8,497,528 B2 | 7/2013 | Lee et al. | |
| 8,610,240 B2 | 12/2013 | Lee et al. | |
| 8,680,576 B2 | 3/2014 | Ching et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,785,285 B2 | 7/2014 | Tsai et al. | |
| 8,796,759 B2 | 8/2014 | Perng et al. | |
| 8,809,139 B2 | 8/2014 | Huang et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 2008/0315254 A1* | 12/2008 | Fukuda et al. ............... 257/190 |
| 2010/0059764 A1* | 3/2010 | Luo et al. ............... 257/77 |
| 2011/0068396 A1* | 3/2011 | Cheng et al. ............... 257/335 |
| 2011/0068407 A1 | 3/2011 | Yeh et al. | |
| 2011/0183481 A1* | 7/2011 | Dyer ............... 438/198 |
| 2011/0237039 A1* | 9/2011 | Yang et al. ............... 438/285 |
| 2013/0011983 A1 | 1/2013 | Tsai et al. | |
| 2014/0252412 A1 | 9/2014 | Tsai et al. | |

* cited by examiner

*Primary Examiner* — Minchul Yang
(74) *Attorney, Agent, or Firm* — Haynes and Boone, LLP

(57) ABSTRACT

A semiconductor structure and method for forming the same provide a high mobility stressor material suitable for use as source/drain regions or other active devices. The structure is formed in a substrate opening and is doped with an impurity such as boron in upper portions but is void of the impurity in regions that contact the surfaces of the opening. The structure is therefore resistant to out-diffusion of the dopant impurity during high temperature operations and may be formed through selective deposition using reduced pressure chemical vapor deposition or reduced pressure epitaxial deposition.

16 Claims, 2 Drawing Sheets

SEMICONDUCTOR DEVICES UTILIZING PARTIALLY DOPED STRESSOR FILM PORTIONS AND METHODS FOR FORMING THE SAME

TECHNICAL FIELD

The disclosure relates, most generally, to semiconductor devices and methods for forming the same and more particularly to forming transistors and other devices with high mobility stressor materials.

BACKGROUND

In today's semiconductor manufacturing industry, device speed is of critical importance. Faster and faster integrated circuit and other semiconductor devices are being developed to meet the demands of the various applications for which they will be used and to meet the challenges of device designers who are required to devise faster devices that require faster materials in order to meet the application demands.

Device speed can be increased and optimized by utilizing structures and features formed of materials that are characterized by high electron or hole mobility. Such materials include stressor materials used in conjunction with transistors or other devices. These high mobility stressor materials are advantageously doped with dopant impurities to reduce the resistivity of such structures. This adds to the device speed.

While high-mobility stressor materials provide the advantage of high electron and hole mobility and therefore faster devices, they often include dopant impurity materials that tend to out-diffuse at high temperatures. The sequence of fabrication operations used to form integrated circuit and other semiconductor devices typically includes several such high temperature operations. It can be then appreciated that the use of doped high mobility stressor materials in conventional semiconductor manufacturing fabrication sequences, will cause diffusion of the dopant impurity species from the stressor material and such diffusion can cause shorts or otherwise introduce the dopant impurities into regions where they can adversely affect device performance or completely destroy device functionality.

It would therefore be advantageous and desirable to produce and utilize high mobility stressor materials with suitable dopant impurities in semiconductor devices that are compatible with subsequent high temperature semiconductor fabrication operations, i.e. it would be advantageous and desirable to produce high mobility stressor materials with suitable dopant impurities that do not out-diffuse and adversely affect device performance during subsequent high temperature operations.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

FIG. 3 shows an exemplary structure formed according to the disclosure.

DETAILED DESCRIPTION

The disclosure provides high-mobility semiconductor structures suitable for use as source/drain regions and other semiconductor structures and devices. The high-mobility semiconductor structures are doped with at least one dopant impurity having a concentration that varies throughout the structure. The concentration of the at least one dopant impurity may be a gradient or the semiconductor structure may include discrete portions with different dopant concentrations. An outer or lower portion of the high-mobility semiconductor structure is void of the dopant impurity present in other portions of the high-mobility semiconductor structure. The structure is resistant to out-diffusion of the dopant impurity when the structure undergoes subsequent high temperature processing such as annealing or other operations commonly used in semiconductor manufacturing.

Figure 1:
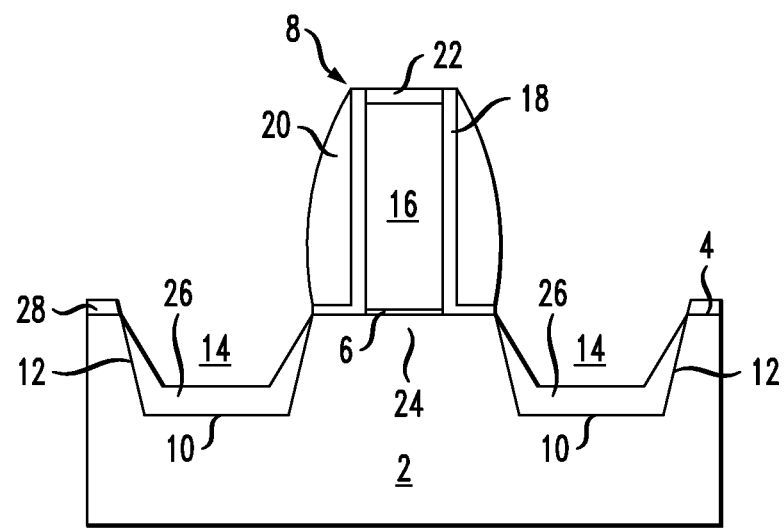
FIGS. 1-3 are cross-sectional views showing an exemplary sequence of processing operations according to the disclosure.

FIG. 1 is a cross-sectional view showing an initial structure formed according to the disclosure. Semiconductor substrate 2 may be a silicon substrate or other suitable substrates used in the semiconductor manufacturing industry. Semiconductor substrate 2 includes substrate surface 4. Gate structure 8 is formed over substrate surface 4 and, more particularly, over transistor channel 24 formed in semiconductor substrate 2. Gate dielectric 6 is formed on substrate surface 4 and therefore at the interface of gate structure 8 and transistor channel 24. Transistor channel 24 is formed using conventional or other means and may be a p-channel such as used in PMOS (p-type metal oxide semiconductor) devices or an n-channel such as used in NMOS (n-type metal oxide semiconductor) devices. Various suitable gate dielectric materials may be used as gate dielectric 6. Gate structure 8 is intended to be exemplary only and in the exemplary embodiment includes gate electrode 16, spacers 18, spacers 20, and silicide 22. Each of these features in intended to be exemplary only and various different gate structures and configurations are known and may be used in other exemplary embodiments.

Openings are formed adjacent gate structure 8 to receive materials that will serve as source/drain regions. Original openings 14 are defined by bottoms 10 and sidewalls 12 and may be formed in semiconductor substrate 2 extending downwardly from substrate surface 4 using various known or other methods such as etching. FIG. 1 shows a structure after lower film portion 26 has been formed along bottom 10 and sidewalls 12 of original opening 14. Prior to the formation of lower film portion 26, a pre-cleaning operation is carried out, the pre-cleaning operation capable of removing native oxides such as may form on bottom 10 and sidewalls 12 of opening 14 but not sufficient to remove surface oxides such as oxide 28 formed on substrate surface 4. Conventional or other suitable pre-clean or oxide etch operations such as wet chemical dips may be used and carried out for a time sufficient to remove native oxides from bottom 10 and sidewalls 12 while leaving oxide 28 substantially intact on substrate surface 4.

Lower film portion 26 may be formed using a reduced pressure epitaxial deposition system or a reduced pressure chemical vapor deposition (RPCVD) system. Lower film portion 26 is selectively formed in opening 14 due to the continued presence of oxide 28 on substrate surface 4. Lower film portion 26 may include a thickness ranging from about 50 to about 150 angstroms over bottom 10. In one exemplary embodiment, lower film portion 26 may be SiGe but other suitable stressor films may be used in other exemplary embodiments. Other exemplary materials that may be used as stressor materials include but are not limited to SiC, GeSn and SiGeSn. Lower film portion 26 is free of a first dopant impurity that will be included in subsequent portions of the stressor material formed in opening 14. According to one exemplary embodiment in which lower film portion 26 is SiGe, it may be completely void of any other dopant impurities. According to one exemplary embodiment as will be discussed herein, boron may be the first dopant impurity absent from lower film portion 26 and included in other film portions, but this is intended to be exemplary only and in other exemplary embodiments, other suitable dopant impurities may be used.

Figure 2:
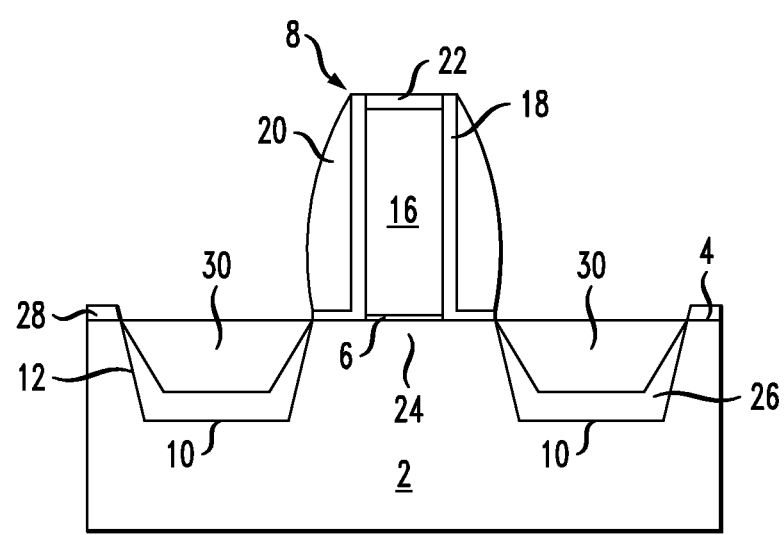

Now turning to FIG. 2, intermediate film portion 30 is formed over lower film portion 26. Intermediate film portion 30 may also be formed using reduced pressure epitaxial growth or RPCVD and will be selectively formed within opening 14 and on lower film portion 26. Intermediate film portion 30 may be formed of the same stressor material, i.e., SiGe, as lower film portion 26 but intermediate film portion 30 will additionally include the first dopant impurity therein. A boron source such as $B_2H_6$ gas may be used in the exemplary embodiment in which boron is the first dopant impurity. The first dopant impurity may be present in intermediate film portion 30 in a concentration of about 10e19 atoms/cc but other concentrations may be used in other exemplary embodiments. According to one exemplary embodiment, a continuous film formation operation may be carried out to form both lower film portion 26 and intermediate film portion 30, with a boron source such as $B_2H_6$ gas introduced after lower film portion 26 has been formed.

Figure 3:
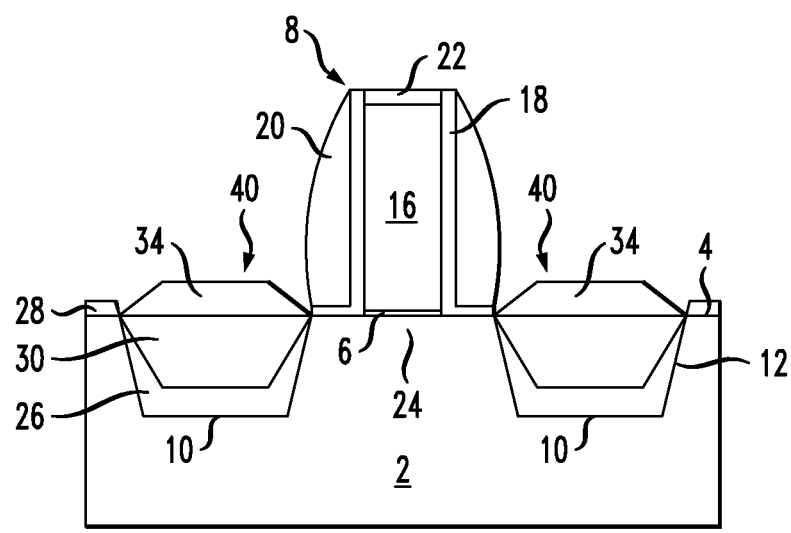

Now turning to FIG. 3, upper film portion 34 is formed over intermediate film portion 30 and may be formed using the same formation methods as discussed in conjunction with lower film portion 26 and intermediate film portion 30. Upper film portion 34 extends above substrate surface 4 and is formed of the same stressor material as lower film portion 26 and intermediate film portion 30, i.e. SiGe in the exemplary embodiment and includes the same first dopant impurity, i.e., boron in the exemplary embodiment, as intermediate film portion 30 but, according to one exemplary embodiment, upper film portion 34 includes boron at a higher dopant concentration. According to one exemplary embodiment, in the deposition process used to sequentially form lower film portion 26, intermediate film portion 30 and upper film portion 34, the $B_2H_6$ gas flow is simply increased when upper film portion 34 is being formed. According to one exemplary embodiment in which the concentration of boron impurities is on the order of about 10e19 atoms/cc in intermediate film portion 30, the boron concentration in upper film portion 34 may be on the order of about 10e20 atoms/cc, but this is exemplary only and other concentrations may be used in other exemplary embodiments.

The illustrated embodiment of FIG. 3 shows three distinguishable portions of the same stressor material SiGe: lower film portion 26, intermediate film portion 30 and upper film portion 34 to show that boron concentration differs in different sections of the formed source/drain structures 40. The lower portion of source/drain structures 40, i.e., lower film portion 26 in the illustrated embodiment, is free of the boron dopant impurity present in other portions of source/drain structures 40. In other exemplary embodiments, a more gradual dopant concentration of the dopant impurity such as boron will be present and distinctive boundaries between discrete film portions with different dopant impurity levels may not be present. Rather, a gradient of dopant impurities may be present in source/drain structures 40 such that the dopant impurity has a higher concentration towards the top of the structure and a zero concentration in the region bounding bottom 10 and sidewalls 12. In other exemplary embodiments, the source/drain structures 40 may include a lower portion void of boron, i.e. the portion adjacent bottom 10 and sidewalls 12, and an upper portion including boron as a dopant impurity therein in which the boron concentration is relatively constant throughout the doped portion, i.e. a gradual gradient of changing dopant concentration may not be present.

In other exemplary embodiments, dopant impurities other than boron may be used and stressor materials other than SiGe may be used. For example, other suitable first dopant impurities that are present in different concentrations throughout source/drain structures 40 may include phosphorus, arsenic and antimony. Other suitable stressor materials used for source/drain structures 40 may include SiC, GeSn and SiGeSn, but still other suitable stressor materials may be used in other exemplary embodiments.

Further processing may be carried out upon the structure shown in FIG. 3 to provide contact to the gate structure 8 and source/drain regions 40 according to known and other suitable methods for contacting transistor devices. In addition to the contact and interconnection fabrication steps, several additional semiconductor fabrication operations are carried out to form a final integrated circuit or other semiconductor device. These additional processing operations include one or several high temperature operations and an aspect of the disclosure is that boron out-diffusion is prevented due to the presence of the lower film portion 26 of source/drain regions 40 which are void of boron.

According to other exemplary embodiments, the structure formed of high-mobility doped material, source/drain structures 40 in the illustrated embodiment, may be used for other purposes in semiconductor manufacturing and is not limited to use as a source/drain region.

According to still other exemplary embodiments, the structure formed of high-mobility doped material, source/drain structures 40 in the illustrated embodiment, may be formed in other devices formed on other substrates such as SGOI, SiGe on insulator, substrates, or other suitable substrates used in the semiconductor manufacturing industry.

According to one aspect, a transistor structure is provided. The transistor structure comprises a gate structure at least partially disposed over a gate dielectric disposed on a channel formed in a semiconductor substrate and opposed source/drain regions, each formed in an opening in the semiconductor substrate adjacent the gate structure and including a lower portion of SiGe free of a first dopant impurity, a middle portion of SiGe including a lower first dopant impurity concentration and an upper portion of SiGe including a higher first dopant impurity concentration.

According to another aspect, a semiconductor device is provided. The semiconductor device comprises source/drain regions formed in a semiconductor substrate. Each source/drain region is disposed in an opening formed in a surface of the semiconductor substrate and comprises a lower portion disposed on a bottom and extending at least partially upwardly along sidewalls of the opening, the lower portion formed of SiGe free of boron dopant impurities, and an upper portion of SiGe including boron dopant impurities therein, disposed over the lower portion and extending upwardly at least to said substrate surface.

According to yet another aspect, method for forming a semiconductor device is provided. The method comprises: providing a semiconductor substrate; forming a gate structure over a transistor channel formed in the semiconductor substrate; forming an opening in the semiconductor substrate along each of opposed sides of the gate structure; and selectively depositing SiGe in the openings by first depositing SiGe not doped with a first dopant impurity then depositing SiGe doped with said first dopant impurity to fill the openings.

The preceding merely illustrates the principles of the disclosure. It will thus be appreciated that those skilled in the art will be able to devise various arrangements which, although not explicitly described or shown herein, embody the principles of the disclosure and are included within its spirit and scope. For example, the use of SiGe as the stressor film and the use of boron as the dopant impurity, are intended to be exemplary only, as other materials may be used in other embodiments.

Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A transistor structure comprising:
a gate structure at least partially disposed over a gate dielectric disposed on a channel formed in a semiconductor substrate, said gate structure including a gate electrode and opposed spacer structures disposed along opposed sidewalls of said gate electrode; and
opposed source/drain regions, each formed on said semiconductor substrate adjacent said gate structure and each including:
an opening in the semiconductor substrate, wherein the opening has a bottom surface and two opposing sidewalls each extending from a top surface of the semiconductor substrate to the bottom surface;
a lower portion of SiGe free of a first dopant impurity, wherein the lower portion of SiGe is disposed on the bottom surface and each of the two opposing sidewalls, such that the entirety of each of the sidewalls and bottom of the opening interface the lower portion of SiGe free of the first dopant impurity;
an intermediate portion of SiGe having a lower level of said first dopant impurity therein, the intermediate portion of SiGe disposed on the lower portion of SiGe and in the opening in said semiconductor substrate; and
an upper portion of SiGe having a higher level of said first dopant impurity, the upper portion being disposed on the intermediate portion of SiGe,
wherein said upper portion of SiGe is disposed over a surface of said semiconductor substrate.

2. The transistor structure as in claim 1, wherein said first dopant impurity comprises boron.

3. The transistor structure as in claim 1, wherein said lower portion of SiGe includes a thickness of about 50-150 angstroms, said transistor structure is a PMOS transistor structure and said channel is a p-type channel.

4. The transistor structure as in claim 1, wherein said lower level of boron dopant concentration includes a concentration in the range of about 10e19 atoms/cubic centimeter and said higher level of boron dopant concentration includes a dopant concentration of about 10e20 atoms/cubic centimeter.

5. The transistor structure of claim 1, wherein each of the lower, intermediate and upper portions are not underneath an interface between said opposed spacer structures of said gate structure and the surface of the semiconductor substrate.

6. The transistor structure of claim 1, wherein the intermediate portion of SiGe is epitaxially-grown SiGe.

7. The transistor structure of claim 1, wherein the top surface defines a top edge of the channel.

8. The transistor structure of claim 1, wherein the upper portion of SiGe is an epitaxially-grown SiGe.

9. The transistor structure of claim 1, wherein the lower portion of SiGe free of a first dopant impurity is disposed on the entirety of the sidewalls and bottom of the opening such that out-diffusion of a dopant from the intermediate portion of SiGe to the semiconductor substrate is reduced.

10. A semiconductor device comprising:
a gate structure formed on a top surface of a semiconductor substrate;
source/drain regions formed on the semiconductor substrate, at least a portion of each said source/drain region is disposed in an opening formed in the top surface of said semiconductor substrate, wherein the opening is defined by sidewalls of a length extending from a top surface of the semiconductor substrate to a bottom surface of the opening, and wherein the source/drain regions are comprising:
a lower portion disposed on a bottom and extending upwardly along sidewalls of said opening such that the lower portion is disposed on the length of each the sidewalls of the opening, said lower portion formed of a stressor material having a first level of boron dopant impurities, wherein the lower portion has a first thickness at first end of the length of each of the sidewalls and a second thickness at a second opposing end of the length of each of the sidewalls, the first thickness being greater than the second thickness,
an intermediate portion disposed on the lower portion, said intermediate portion formed of the stressor material having a second level of boron dopant impurities therein, the second level being greater than the first level, and
an upper portion of the stressor material including a third level of boron dopant impurities therein, the third level being greater than the first level, and wherein the upper portion of stressor material is disposed over said intermediate portion;

wherein said source/drain regions are formed in said semiconductor substrate adjacent opposite ends of a transistor channel formed in said semiconductor substrate.

11. The semiconductor device as in claim 10, wherein said upper portion of the stressor material extends above the top surface of said semiconductor substrate.

12. The semiconductor device of claim 10, wherein the first level of boron concentration is substantially zero.

13. The semiconductor device of claim 10, wherein the source/drain regions have a gradient of boron dopant levels including the first, second and third levels.

14. The semiconductor device of claim 10, wherein the stressor material is SiGe.

15. The semiconductor device of claim 10, wherein the stressor material is epitaxially grown SiGe in each of the lower, upper, and intermediate portions.

16. The semiconductor device of claim 10, wherein the stressor material is one of SiC, GeSn, and SiGeSn.

* * * * *